(12) United States Patent
Ono

(10) Patent No.: US 8,829,499 B2
(45) Date of Patent: Sep. 9, 2014

(54) SEMICONDUCTOR ELEMENT AND ELECTRONIC APPARATUS

(75) Inventor: Hideki Ono, Tokyo (JP)

(73) Assignee: Sony Corporation (JP)

( * ) Notice: Subject to any disclaimer, the term of this patent is extended or adjusted under 35 U.S.C. 154(b) by 193 days.

(21) Appl. No.: 13/465,748

(22) Filed: May 7, 2012

(65) Prior Publication Data

US 2012/0292758 A1    Nov. 22, 2012

(30) Foreign Application Priority Data

May 19, 2011    (JP) .................................. 2011-112316

(51) Int. Cl.
*H01L 29/417*    (2006.01)
*H01L 51/00*     (2006.01)
*H01L 51/10*     (2006.01)
*H01L 51/05*     (2006.01)

(52) U.S. Cl.
CPC ........ *H01L 51/0545* (2013.01); *H01L 51/0018* (2013.01); *H01L 51/105* (2013.01)

USPC .......................................................... 257/40

(58) Field of Classification Search
USPC .............. 257/40, E51.006, E27.117, E25.008
See application file for complete search history.

(56) References Cited

U.S. PATENT DOCUMENTS

| 5,874,326 | A  | * | 2/1999  | Lyu ............................... 438/158 |
| 6,111,357 | A  | * | 8/2000  | Fleming et al. ............... 313/509 |
| 8,134,152 | B2 | * | 3/2012  | Choi et al. ...................... 257/43 |
| 8,158,275 | B2 | * | 4/2012  | Ie et al. ......................... 428/704 |
| 8,513,654 | B2 | * | 8/2013  | Saito et al. ...................... 257/40 |
| 2012/0228596 | A1 | * | 9/2012  | Fujita et al. ..................... 257/40 |
| 2012/0319116 | A1 | * | 12/2012 | Ono et al. ....................... 257/59 |

FOREIGN PATENT DOCUMENTS

WO        2010061823        6/2010

* cited by examiner

*Primary Examiner* — George Fourson, III
(74) *Attorney, Agent, or Firm* — Sheridan Ross P.C.

(57) ABSTRACT

A semiconductor element including an organic semiconductor layer and a layer disposed on the upper surface of the organic semiconductor layer, wherein the outline of the layer is inside the outline of the organic semiconductor layer.

8 Claims, 15 Drawing Sheets

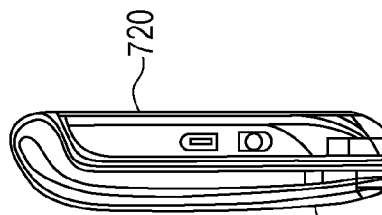
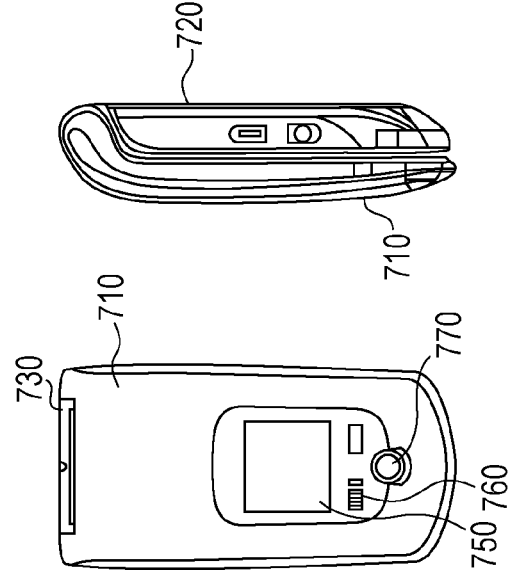
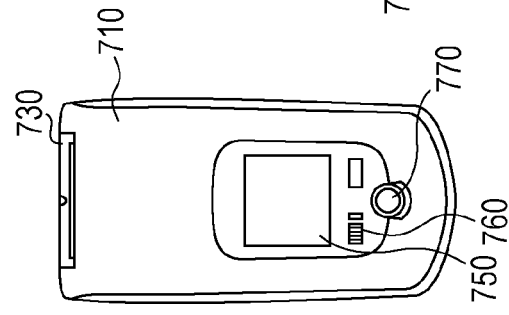
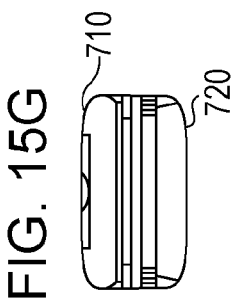
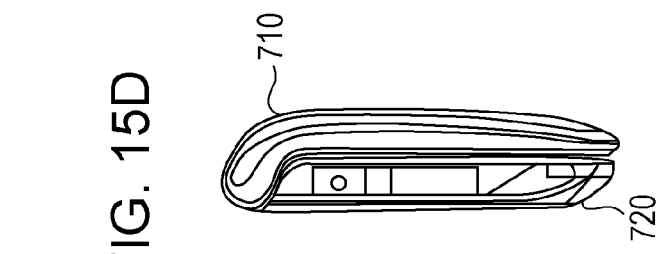
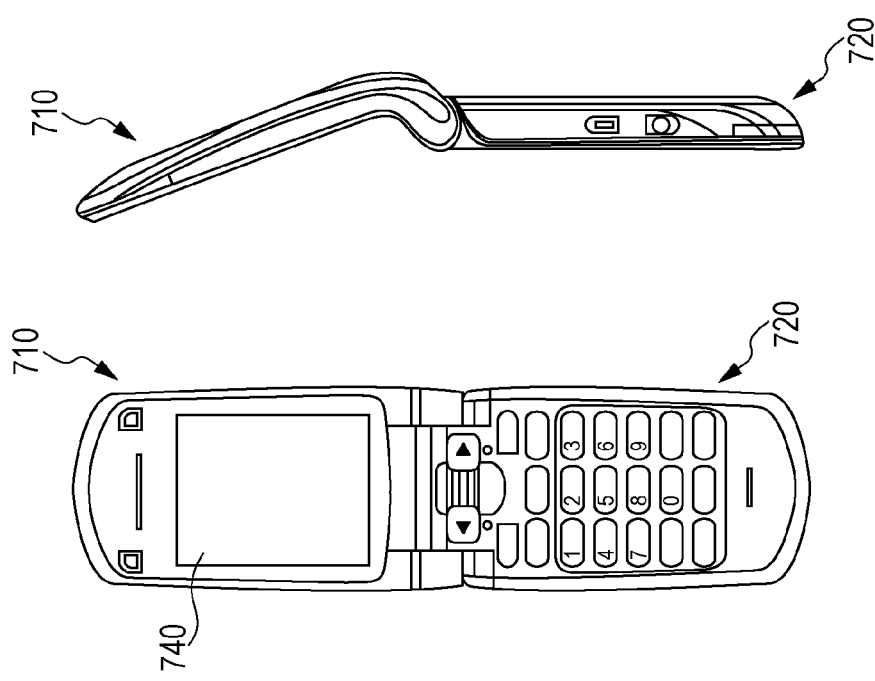

SEMICONDUCTOR ELEMENT AND ELECTRONIC APPARATUS

CROSS REFERENCES TO RELATED APPLICATIONS

The present application claims priority to Japanese Priority Patent Application JP 2011-112316 filed in the Japan Patent Office on May 19, 2011, the entire content of which is hereby incorporated by reference.

BACKGROUND

The present disclosure relates to a semiconductor element including an organic semiconductor element and an electronic apparatus provided with this semiconductor element.

The semiconductor element by using an organic semiconductor, e.g., an organic thin film transistor (TFT), has been developed for the purpose of application to a display device, e.g., an organic electro luminescence (EL) display or flexible electronic paper, or an electronic apparatus, e.g., a flexible printed circuit board, an organic thin film solar cell, or a touch panel.

In a production process of the organic TFT, when an organic semiconductor layer serving as a channel is formed into an island shape, initially, a layer of a metal or the like is formed as a protective film on the upper surface of the organic semiconductor layer, and a common photoresist is applied to this layer. Subsequently, the photoresist film is patterned through, for example, photolithography to form a mask, and the protective film and the organic semiconductor layer are etched sequentially by using the resulting mask (refer to, for example, International Publication No. WO/2010/061823).

SUMMARY

However, regarding the method in related art described in International Publication No. WO/2010/061823, the organic semiconductor layer and the layer on the upper surface thereof are etched into the same shape and, therefore, an end portion of the layer on the upper surface of the organic semiconductor layer may extend off the organic semiconductor layer, so as to from an eaves portion. Such an eaves portion causes break in a wiring layer formed on the organic semiconductor layer and an improvement has been studied.

It is desirable to provide a semiconductor element, in which defects in the shape of a layer on the upper surface of an organic semiconductor layer are reduced, and an electronic apparatus provided with the same.

A semiconductor element according to an embodiment of the present disclosure includes an organic semiconductor layer and a layer disposed on the upper surface of the organic semiconductor layer, wherein the outline of the layer is inside the outline of the organic semiconductor layer.

Regarding the semiconductor element according to an embodiment of the present disclosure, the outline of the layer on the upper surface of the organic semiconductor layer is inside the outline of the organic semiconductor layer and, thereby, it is suppressed that an end portion of the layer on the upper surface of the organic semiconductor layer extends off the organic semiconductor layer and causes defects in the shape, such as, an eaves portion. Therefore, an occurrence of break in the wiring layer disposed on the organic semiconductor layer because of the wiring layer being cut at the eaves portion is suppressed.

An electronic apparatus according to an embodiment of the present disclosure is provided with the above-described semiconductor element.

The electronic apparatus according to an embodiment of the present disclosure is provided with the above-described semiconductor element in which defects in the shape, such as, an eaves portion, are reduced and, therefore, break in the wiring layer disposed on the organic semiconductor layer is suppressed. Consequently, a large scale integrated circuit may be formed by joining a plurality of the above-described semiconductor elements.

Regarding the semiconductor element according to an embodiment of the present disclosure, the outline of the layer disposed on the upper surface of the organic semiconductor layer is specified to be inside the outline of the organic semiconductor layer and, thereby, it may be suppressed that an end portion of the layer on the upper surface of the organic semiconductor layer extends off the organic semiconductor layer and causes defects in the shape, such as, an eaves portion. Therefore, in the case where an electronic apparatus is formed by using this semiconductor element, break in the wiring layer disposed on the organic semiconductor layer may be suppressed, and a large scale integrated circuit may be formed by joining a plurality of the above-described semiconductor elements.

Additional features and advantages are described herein, and will be apparent from the following Detailed Description and the figures.

BRIEF DESCRIPTION OF THE FIGURES

FIG. 15A is a front view of Application example 6 in an open state, FIG. 15B is a side view thereof, FIG. 15C is a front view of that in a close state, FIG. 15D is a left side view, FIG. 15E is a right side view, FIG. 15F is a top view, and FIG. 15G is a bottom view.

DETAILED DESCRIPTION

The embodiments according to the present disclosure will be described below in detail with reference to the drawings. The explanations will be made in the following order.

1. First embodiment (example in which layer on upper surface of organic semiconductor layer is formed from metal and wiring layer is formed from the same material as that for the layer)

2. Second embodiment (example in which layer on upper surface of organic semiconductor layer is formed from metal and wiring layer is formed from material different from that for the layer)

3. Third embodiment (example in which layer on upper surface of organic semiconductor layer is formed from metal oxide)

4. Fourth embodiment (example in which layer on upper surface of organic semiconductor layer is formed from electrically conductive polymer)

5. Display device and application example

First Embodiment

Figure 1A:
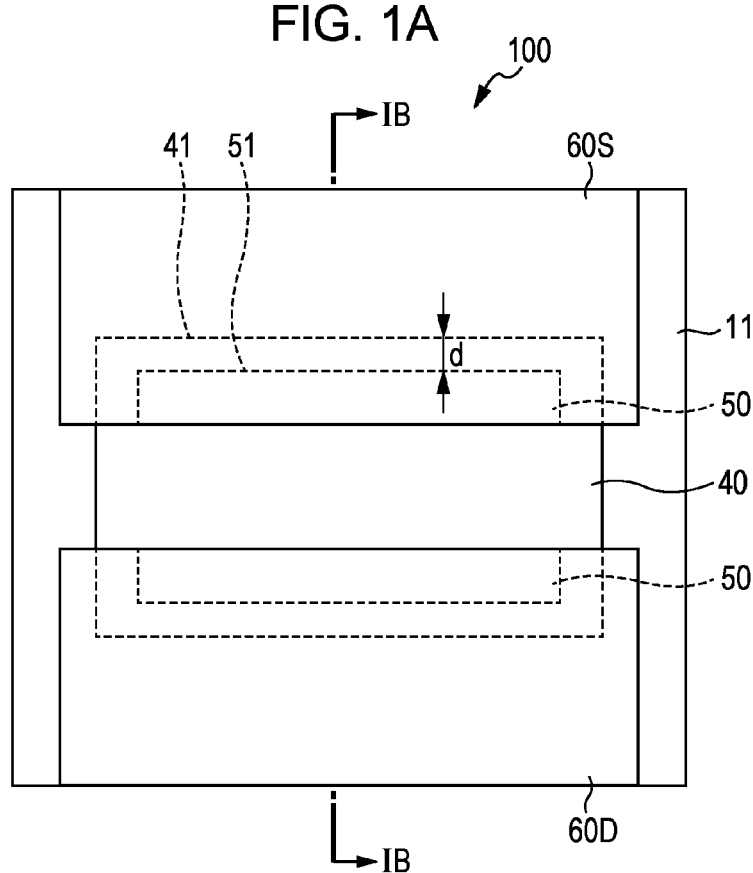
FIG. 1A is a plan view showing the configuration of an organic TFT according to a first embodiment of the present disclosure.
Figure 1B:
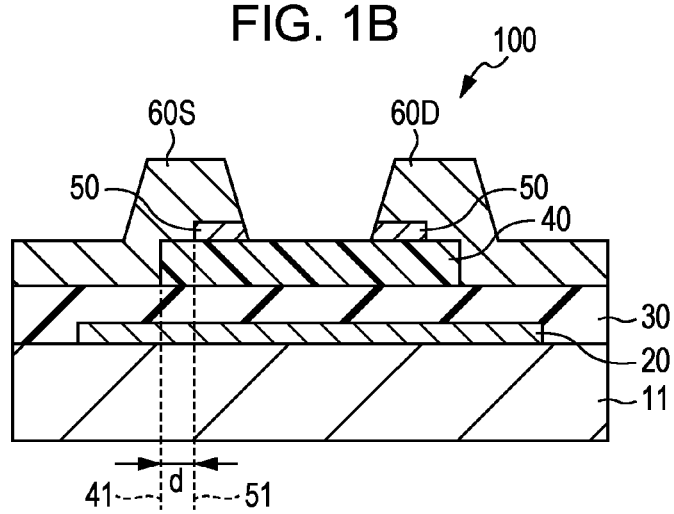
FIG. 1B is a sectional view showing the configuration along a line IB-IB shown in FIG. 1A.

FIGS. 1A and 1B show the configuration of an organic TFT 100 serving as a semiconductor element according to a first embodiment of the present disclosure. This organic TFT 100 is of top-contact staggered type used for, for example, an active matrix circuit of a display device. The organic TFT 100 includes, for example, a gate electrode 20, a gate insulating film 30, an organic semiconductor layer 40, an upper surface layer 50, a source electrode 60S, and a drain electrode 60D on a substrate 11 in that order. Here, the upper surface layer 50 corresponds to a concrete example of "a layer disposed on an upper surface of an organic semiconductor layer" according to an embodiment of the present disclosure, and the source electrode 60S and the drain electrode 60D correspond to concrete examples of "a wiring layer".

The substrate 11 is different depending on the use and may be, for example, a substrate of glass, a plastic material, a metal material, or the like; a film of a plastic material, a metal material, or the like; or paper (common paper). Alternatively, the substrate 11 may be a flexible substrate. Examples of plastic materials include polyethersulfone (PES), polycarbonate (PC), polyimide (PI), polyethylene terephthalate (PET), polyethylene naphthalate (PEN), and polyethyl ether ketone (PEEK). Examples of metal materials include aluminum (Al), nickel (Ni), and stainless steel. In this regard, various layers, e.g., a buffer layer to ensure adhesion and a gas barrier layer to prevent gas release, may be disposed on the surface of the substrate 11.

The gate electrode 20 is disposed on the substrate 11 and is formed from, for example, at least one type of a metal material, an inorganic electrically conductive material, an organic electrically conductive material, and a carbon material. Examples of metal materials include aluminum (Al), copper (Cu), molybdenum (Mo), titanium (Ti), chromium (Cr), nickel (Ni), palladium (Pd), gold (Au), silver (Ag), platinum (Pt), and alloys containing them. Examples of inorganic electrically conductive materials include indium oxide ($In_2O_3$), indium tin oxide (ITO), indium zinc oxide (IZO), and zinc oxide (ZnO). Examples of organic electrically conductive materials include polyethylenedioxythiophene (PEDOT) and polystyrene sulfonic acid (PSS). Examples of carbon materials include graphite. The gate electrode 20 may be formed by stacking at least two layers of the above-described various materials.

The gate insulating film 30 covers the gate electrode 20 and, in addition, is formed from at least one type of an inorganic insulating material and an organic insulating material. Examples of inorganic insulating materials include silicon oxide ($SiO_x$), silicon nitride ($SiN_x$), aluminum oxide ($Al_2O_3$), titanium oxide ($TiO_2$), hafnium oxide ($HfO_x$), and barium titanate ($BaTiO_3$). Examples of organic electrically conductive materials include polyvinylphenol (PVP), polyimide, polymethacrylic acid-acrylate, photosensitive polyimide, photosensitive novolak resin, and polyparaxylylene. The gate insulating film 30 may be formed by stacking at least two layers of the above-described various materials.

The organic semiconductor layer 40 is formed from, for example, a peri-xanthenoxanthene (PXX) derivative. Alternatively, the organic semiconductor layer 40 may be formed from other organic semiconductor materials, e.g., pentacene ($C_{22}H_{14}$) and polythiophene.

The upper surface layer 50 is disposed on the upper surface of the organic semiconductor layer 40 and is a contact layer to electrically connect the organic semiconductor layer 40 to the source electrode 60S and the drain electrode 60D favorably. Therefore, it is preferable that the upper surface layer 50 is formed from an electrically conductive material, in particular a metal capable of providing ohmic contact with the organic semiconductor layer 40 by itself. Furthermore, the upper surface layer 50 has also a function as a protective film to prevent direct contact of the organic semiconductor layer 40 with a photoresist in a production process described later. It is preferable that the upper surface layer 50 is formed from a material capable of being wet-etched. Examples of constituent materials for the above-described upper surface layer 50 include gold (Au), copper (Cu), silver (Ag), nickel (Ni), and titanium (Ti). Concretely, the upper surface layer 50 has a thickness of 50 nm and is formed from gold (Au). Gold (Au) has the highest work function and, thereby, it is possible to provide an excellent function as a hole injection layer to the upper surface layer 50.

The outline 51 of the upper surface layer 50 is inside the outline 41 of the organic semiconductor layer 40. Consequently, regarding this organic TFT 100, defects in the shape of the upper surface layer 50 may be reduced.

It is desirable that the amount of recession d of the outline 51 of the upper surface layer 50 (distance between the outlines 51 and 41) is, for example, about 1 μm to 2 μm.

The source electrode 60S and the drain electrode 60D are disposed discretely from each other on the upper surface and the side surface of the organic semiconductor layer 40 provided with the upper surface layer 50 and the upper surface of the gate insulating film 30. For example, the source electrode 60S and the drain electrode 60D have a thickness of 200 nm and are formed from the same material as that for the contact layer 50, that is, gold (Au).

This organic TFT 100 may be produced as described below, for example.

FIGS. 2A to 4B show a method for manufacturing the organic TFT 100 shown in FIGS. 1A and 1B in the order of steps. Initially, the substrate 11 formed from the above-described material is prepared. A gate electrode material film (not shown in the drawing) formed from the above-described metal material is formed on this substrate 11 by, for example, a vacuum film forming method, a coating method, or a plating method. Examples of vacuum film forming methods include a vacuum evaporation method, a flash evaporation method, a sputtering method, a physical vapor deposition method (PVD), a chemical vapor deposition method (CVD), a pulse laser deposition method (PLD), and an arc discharge method. Examples of coating methods include a spin coating method, a slit coating method, a bar coating method, and a spray coating method. Examples of plating methods include an electroplating method and an electroless plating method.

Subsequently, a mask (not shown in the drawing) of a resist pattern or the like is formed on the resulting gate electrode material film. The gate electrode material film is etched by using the mask and, thereafter, the mask is removed by using an ashing method, an etching method, or the like. In this manner, the gate electrode 20 is formed on the substrate 11, as shown in FIG. 2A.

In the case where the resist pattern is formed, for example, a photoresist is applied, so as to form a resist film and, thereafter, the photoresist film is patterned by using photolithography, a laser writing method, an electron-beam writing method, an X-ray writing method, or the like. However, the resist pattern may be formed by using a resist transfer method or the like. Examples of methods for etching the gate electrode material film include a dry etching method and a wet etching method by using an etchant solution. Examples of dry etching methods include ion milling and reactive ion etching (RIE). The same etching methods are employed as a method for removing the mask.

As for the method for forming the gate electrode 20 and the like, printing methods, e.g., an ink jet method, a screen printing method, a gravure printing method, and a gravure off-set printing method, may be employed. Alternatively, a metal pattern may be formed as the mask instead of the resist pattern by using a laser abrasion method, a mask evaporation method, a laser transfer method, or the like. As a matter of course, in order to form the gate electrode 20 and the like, the above-described inorganic electrically conductive materials, organic electrically conductive materials, carbon materials, and the like may be used instead of the metal material.

Figure 2A:
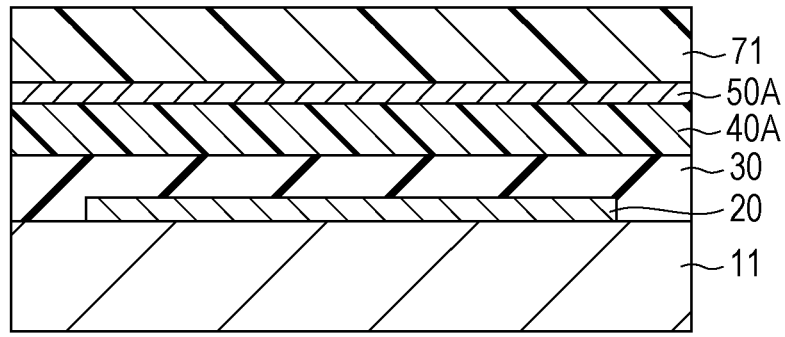
FIGS. 2A to 2C are sectional views showing a method for manufacturing the organic TFT shown in FIGS. 1A and 1B in the order of steps.

Subsequently, as also shown in FIG. 2A, the gate insulating film 30 is formed in such a way as to cover the gate electrode 20. The formation procedure of this gate insulating film 30 is different depending on, for example, the material for forming the film. In the case where the inorganic electrically conductive material is used, the formation procedure may be the same as the procedure in the case where the gate electrode 20 and the like are formed except that, for example, the coating method may be a sol-gel method or the like. In the case where the organic electrically conductive material is used, the formation procedure may be the same as the procedure in the case where the gate electrode 20 is formed except that, for example, a photosensitive material may be patterned by using photolithography or the like.

A solution (mixed solution) in which the above-described organic semiconductor material, e.g., a PXX derivative, is dispersed or dissolved into a solvent, e.g., an organic solvent, is prepared and the resulting mixed solution is applied to the upper surface of the gate insulating film 30, followed by heating (firing). In this manner, as also shown in FIG. 2A, an organic semiconductor material film 40A formed from the above-described organic semiconductor material, e.g., a PXX derivative, is formed on the gate insulating film 30. As for the solvent, for example, toluene, xylene, mesitylene, and tetralin may be used.

Thereafter, as also shown in FIG. 2A, an upper surface layer material film 50A formed from, for example, gold (Au) having a thickness of, for example, 50 nm is formed on the organic semiconductor material film 40A by, for example, resistance heating vacuum evaporation.

After the upper surface layer material film 50A is formed, as also shown in FIG. 2A, a photoresist is applied to the surface of the upper surface layer material film 50A, so as to form a photoresist film 71. As for the photoresist, for example, a positive photoresist of novolak resin may be used, although not limited to this.

Figure 2B:
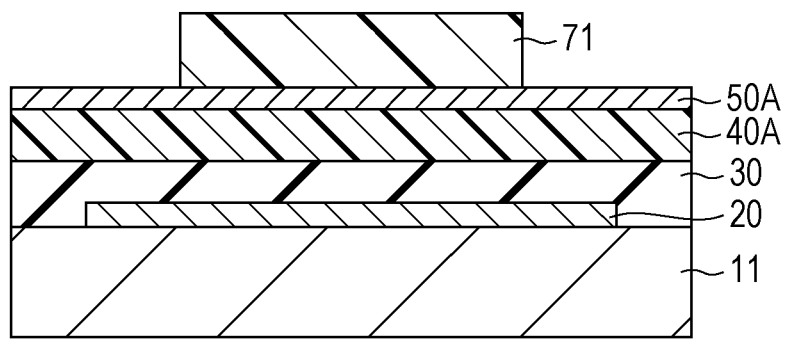

After the photoresist film 71 is formed, as shown in FIG. 2B, the photoresist film 71 is shaped into, for example, a rectangular semiconductor element isolation pattern 100 μm square by, for example, photolithography. In this regard, the shape and the dimension of the semiconductor element isolation pattern are not limited to those in the above-described example.

Figure 2C:
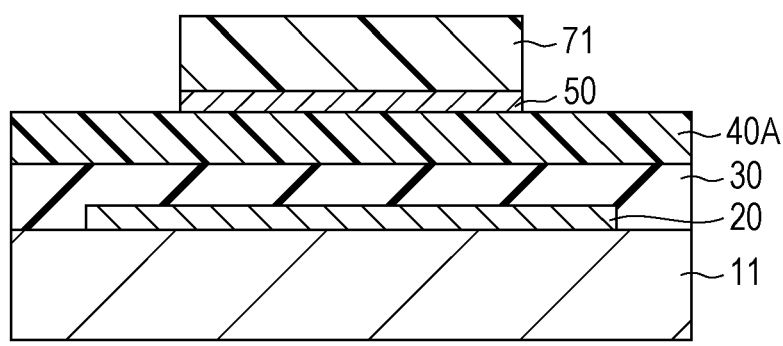

After the photoresist film 71 is shaped, as shown in FIG. 2C, the upper surface layer material film 50A is wet-etched by using the resulting photoresist film 71 as a mask, so as to form the upper surface layer 50.

At that time, the combination of a material for the upper surface layer 50 (or upper surface layer material film 50A) and an etching solution is as described below. In the case where the upper surface layer 50 (or upper surface layer material film 50A) is formed from gold (Au), potassium iodide aqueous solution is used as the etching solution. In the case where the upper surface layer 50 (or upper surface layer material film 50A) is formed from copper (Cu), ammonia water and aqueous hydrogen peroxide; dichromic acid, sulfuric acid, sodium chloride, and water; chromic anhydride; iron chloride; iron chloride, nitric acid, and water; ammonium persulfate; sodium hydroxide; sulfuric acid, acetic acid, nitric acid, and water; or the like is used as the etching solution. In the case where the upper surface layer 50 (or upper surface layer material film 50A) is formed from silver (Ag), aqueous iron(II) nitrate; chromic anhydride, sulfuric acid, and water; sulfuric acid, acetic acid, nitric acid, and water; or the like is used as the etching solution. In the case where the upper surface layer 50 (or upper surface layer material film 50A) is formed from nickel (Ni), nitric acid, sulfuric acid, peroxide, nitrate, and water; a ceric ammonium nitrate based acidic solution; or the like is used as the etching solution. In the case where the upper surface layer 50 (or upper surface layer material film 50A) is formed from titanium (Ti), an ammonium fluoride aqueous solution; hydrofluoric acid and water; ammonia water and aqueous hydrogen peroxide; or the like is used as the etching solution.

It is necessary to select the etching solution which does not dissolve the organic semiconductor material film 40A present under the upper surface layer material film 50A. Here, for example, the upper surface layer 50 (or upper surface layer material film 50A) is formed from gold (Au) and the potassium iodide aqueous solution is used as the etching solution.

Figure 3A:
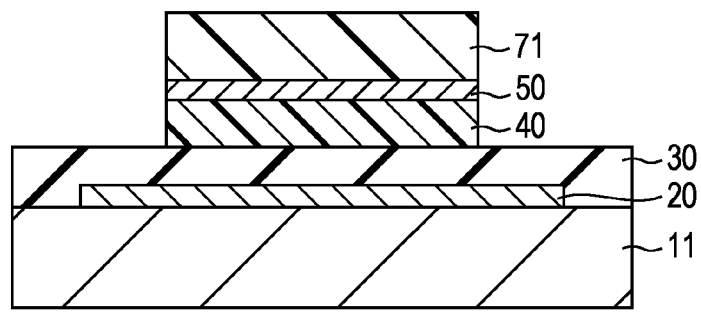
FIGS. 3A to 3C are sectional views showing steps following the step shown in FIG. 2C.

After the upper surface layer 50 is formed, as shown in FIG. 3A, the organic semiconductor material film 40A is etched by using the photoresist film 71 as a mask, so as to form the organic semiconductor layer 40. Regarding an etching method at that time, as for the wet etching, 4-butyrolactone is used as the etching solution. As for the dry etching, reactive ion etching (RIE) by oxygen plasma is employed.

Figure 3B:
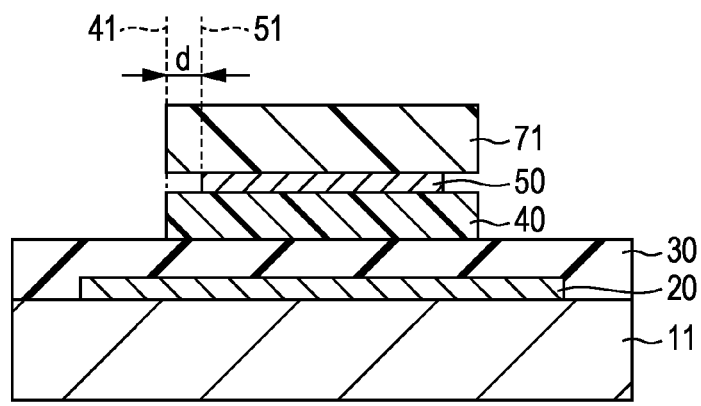

After the organic semiconductor layer 40 is formed, as shown in FIG. 3B, edge trimming is performed, where the outer edge portion of the upper surface layer 50 is removed leaving the photoresist film 71. Consequently, the outline 51 of the upper surface layer 50 is recessed inside the outline 41 of the organic semiconductor layer 40.

As for the edge trimming method, wet etching explained in the etching step of the upper surface layer material film 50A shown in FIG. 2C is employed. Etching in the edge trimming proceeds from the side surface of the upper surface layer 50 toward the lateral direction and, therefore, it is desirable that an etching time 2 to 3 times the etching time of the organic semiconductor material film 40A shown in FIG. 3A is ensured. However, the etching time is selected appropriately in consideration of the pattern shape and a desirable dimension.

Figure 3C:
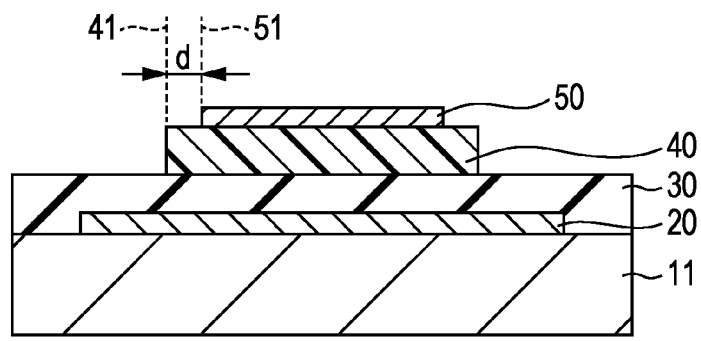

After the edge trimming of the upper surface layer 50 is completed, the whole surface of the photoresist film 71 is exposed to ultraviolet irradiation and is dipped into a developing solution. Consequently, as shown in FIG. 3C, the photoresist film 71 is peeled off.

Figure 4A:
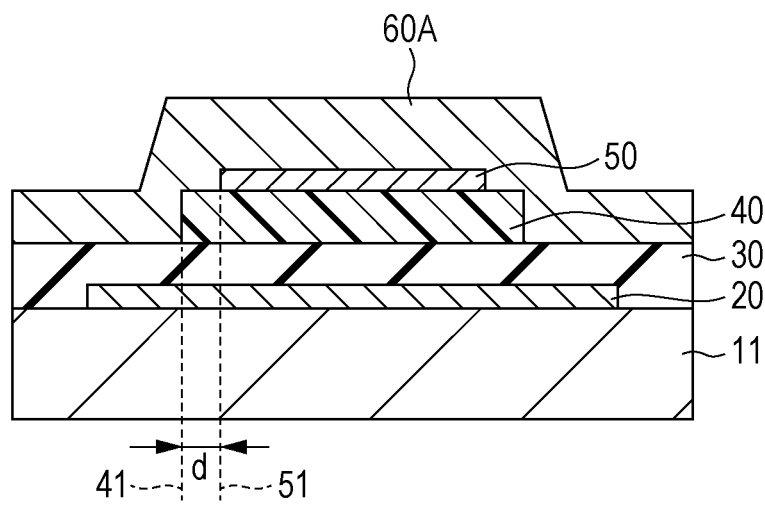
FIGS. 4A and 4B are sectional views showing steps following the step shown in FIG. 3C.

After the photoresist film 71 is peeled off, as shown in FIG. 4A, a source-drain electrode material film 60A formed from the same material as that for the upper surface layer 50, e.g., gold (Au), is formed having a thickness of, for example, 200 nm all over the surface of the substrate 11 by, for example, resistance heating vacuum evaporation.

Figure 4B:
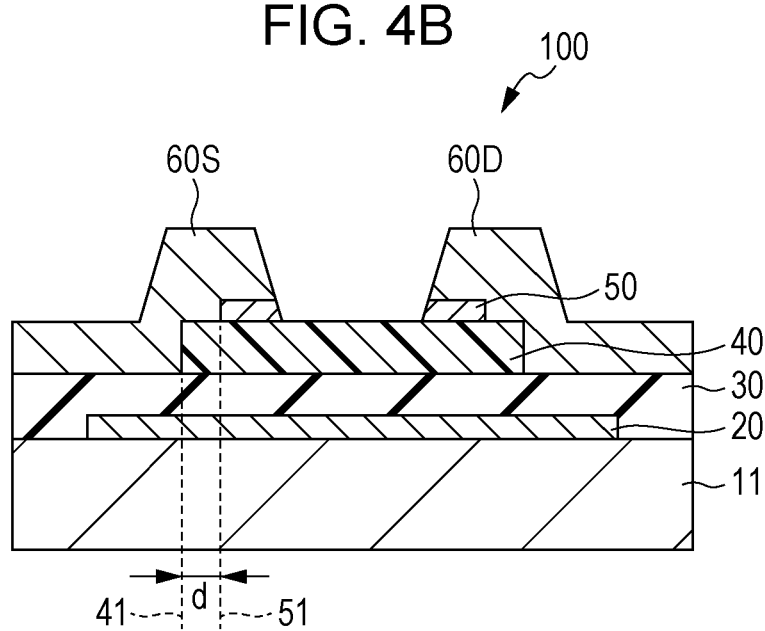

A photoresist film (not shown in the drawing) is formed on the source-drain electrode material film 60A and is shaped into a predetermined shape by, for example, photolithography. Then, the source-drain electrode material film 60A and the upper surface layer 50 are etched by using the resulting photoresist film (not shown in the drawing) as a mask. As for the etching method, wet etching explained in the etching step of the upper surface layer material film 50A shown in FIG. 2C may be employed. Here, for example, the source-drain electrode material film 60A is formed from gold (Au) and the potassium iodide aqueous solution is used as the etching solution. Consequently, as shown in FIG. 4B, the source electrode 60S and the drain electrode 60D are disposed discretely from each other on the upper surface and the side surface of the organic semiconductor layer 40 provided with the upper surface layer 50 and the upper surface of the gate insulating film 30.

After the source electrode 60S and the drain electrode 60D are formed, the whole surface of the photoresist film (not shown in the drawing) is exposed to ultraviolet irradiation and is dipped into a developing solution. Consequently, the photoresist film (not shown in the drawing) is peeled off. In this manner, the organic TFT 100 shown in FIGS. 1A and 1B is completed.

Here, the outline 51 of the upper surface layer 50 is inside the outline 41 of the organic semiconductor layer 40 and, thereby, it is suppressed that an end portion of the upper surface layer 50 extends off the organic semiconductor layer 40 and causes defects in the shape, such as, an eaves portion. Therefore, an occurrence of break because of the source electrode 60S and the drain electrode 60D disposed on the organic semiconductor layer 40 being cut at the eaves portion is suppressed.

Figure 5A:
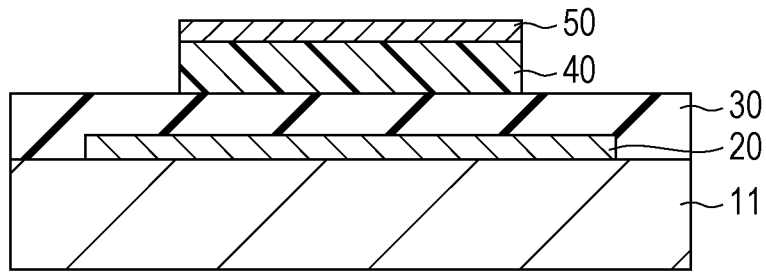
FIGS. 5A to 5C are sectional views showing a part of a manufacturing method in related art in the order of steps.
Figure 5B:
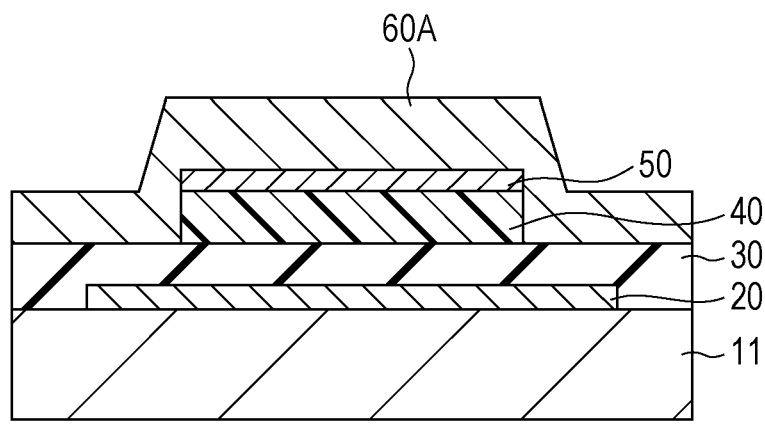
Figure 5C:
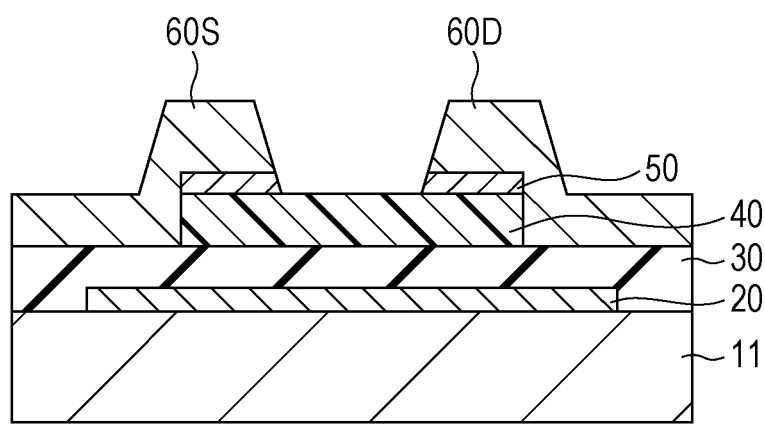

On the other hand, in the case where the edge trimming is not performed, for example, after the photoresist film 71 is peeled off as shown in FIG. 5A, the source-drain electrode material film 60A is formed all over the surface of the substrate 11 as shown in FIG. 5B. Subsequently, as shown in FIG. 5C, the source-drain electrode material film 60A is etched, so as to form the source electrode 60S and the drain electrode 60D.

Figure 6A:
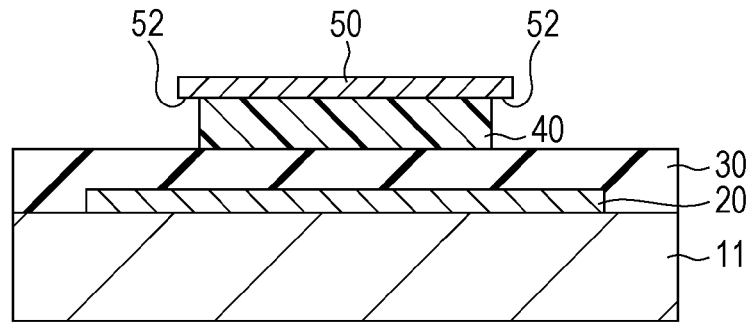
FIGS. 6A to 6C are sectional views for explaining problems in a manufacturing method in related art.
Figure 6B:
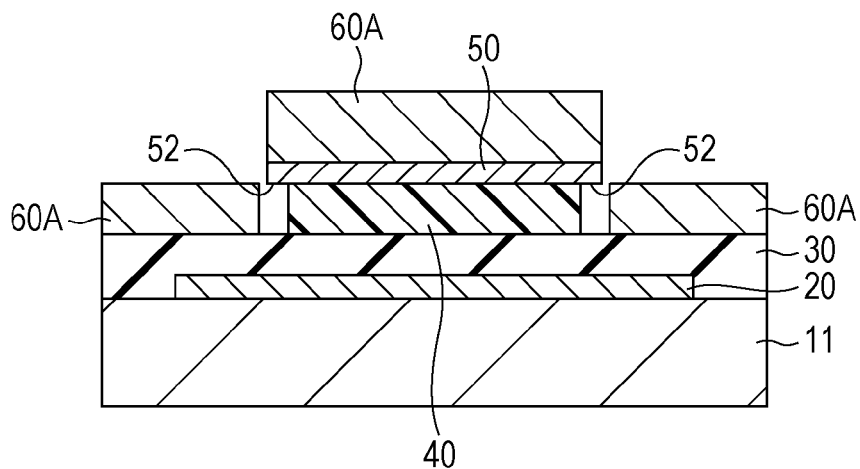
Figure 6C:
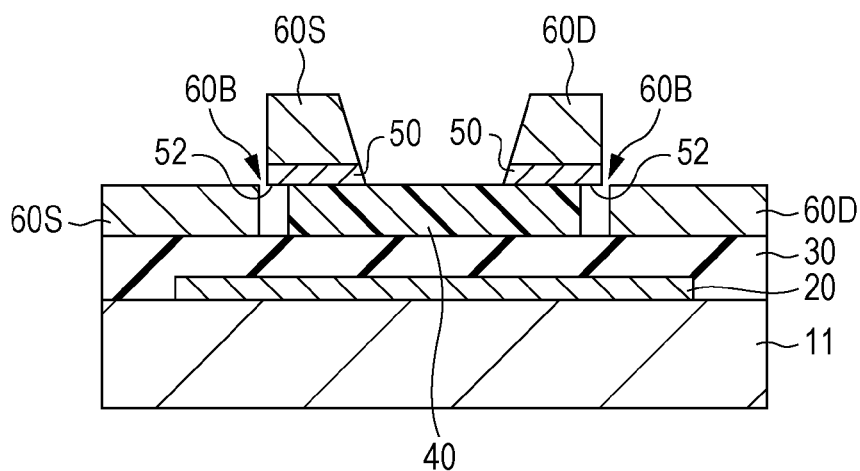

In this case, as shown in FIG. 6A, an end portion of the upper surface layer 50 may extend off the organic semiconductor layer 40 and cause defects in the shape, such as, eaves portions 52. Therefore, as shown in FIG. 6B, source-drain electrode material film 60A may be cut at the eaves portions 52. As a result, as shown in FIG. 6C, breaks 60B may occur at the eaves portions 52 in the source electrode 60S and the drain electrode 60D.

There is some probability of occurrences of this phenomenon. Therefore, in the case where the data line (joining wiring in the same layer as the source electrode 60S and the drain electrode 60D) becomes long (that is, in the case where the number of organic TFTs 100 to be joined is large, for example, in the case where a large scale integrated circuit, e.g., an active matrix circuit, is formed from top-contact staggered type organic TFTs), a significant problem may occur in that the integrated circuit is not easily formed. Furthermore, in the case where the data line is fine, a more significant problem may occur in that the probability of occurrences of break increases.

As described above, in the present embodiment, the outline 51 of the upper surface layer 50 is specified to be inside the outline 41 of the organic semiconductor layer 40 and, thereby, it may be suppressed that an end portion of the upper surface layer 50 extends off the organic semiconductor layer 40 and causes defects in the shape, such as, eaves portions 52. Consequently, an occurrence of break because of the source electrode 60S and the drain electrode 60D disposed on the organic semiconductor layer 40 being cut at the eaves portions 52 is suppressed.

Second Embodiment

Figure 7A:
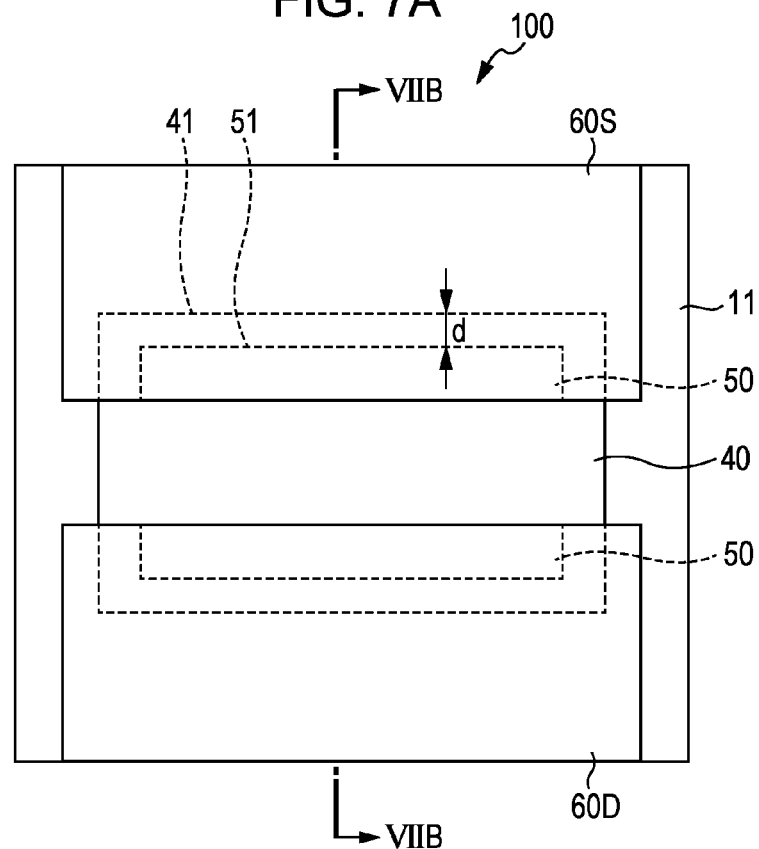
FIG. 7A is a plan view showing the configuration of an organic TFT according to a second embodiment of the present disclosure.
Figure 7B:
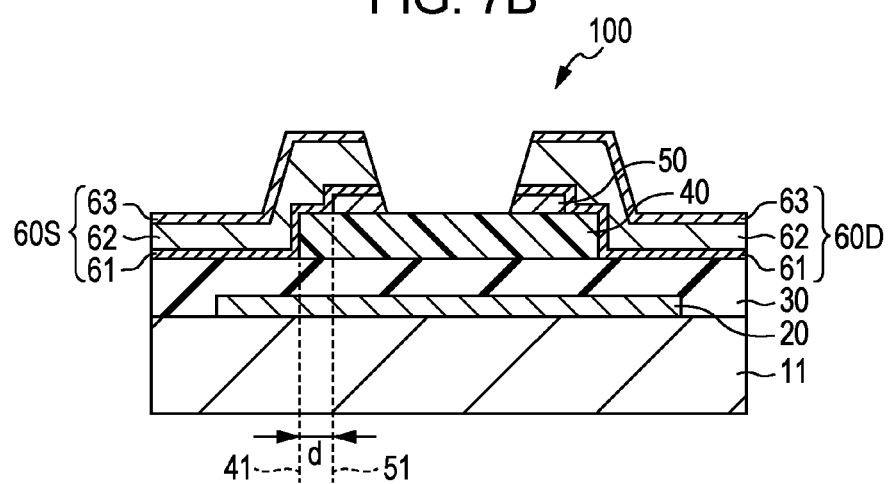
FIG. 7B is a sectional view showing the configuration along a line VIIB-VIIB shown in FIG. 7A.

FIGS. 7A and 7B show the configuration of an organic TFT 100 according to a second embodiment of the present disclosure. In the present embodiment, the source electrode 60S and the drain electrode 60D are formed from a metal different from that for the upper surface layer 50. The organic TFT 100 according to the present embodiment has the same configuration, operation, and effects as those of the above-described organic TFT 100 according to the first embodiment except that described above. Therefore, in the explanation, the corresponding constituents are indicated by the same reference numerals.

The substrate 11, the gate electrode 20, the gate insulating film 30, and the organic semiconductor layer 40 have the same configurations as those in the first embodiment.

The upper surface layer 50 is disposed on the upper surface of the organic semiconductor layer 40 and is a contact layer to electrically connect the organic semiconductor layer 40 to the source electrode 60S and the drain electrode 60D favorably, as in the first embodiment. Therefore, it is preferable that the upper surface layer 50 is formed from an electrically conductive material, in particular a metal, capable of providing ohmic contact with the organic semiconductor layer 40 by itself. Furthermore, the upper surface layer 50 has also a function as a protective film to prevent direct contact of the organic semiconductor layer 40 with a photoresist in a production process described later. It is preferable that the upper surface layer 50 is formed from a material capable of being wet-etched. Examples of constituent materials for the above-described upper surface layer 50 include gold (Au), copper (Cu), silver (Ag), nickel (Ni), and titanium (Ti). Concretely, the upper surface layer 50 has a thickness of 50 nm and is formed from gold (Au). Gold (Au) has the highest work function and, thereby, it is possible to provide an excellent function as a hole injection layer to the upper surface layer 50.

The outline 51 of the upper surface layer 50 is inside the outline 41 of the organic semiconductor layer 40, as in the first embodiment. Consequently, regarding this organic TFT 100, defects in the shape of the upper surface layer 50 may be reduced, as in the first embodiment.

The source electrode 60S and the drain electrode 60D are disposed discretely from each other on the upper surface and the side surface of the organic semiconductor layer 40 provided with the upper surface layer 50 and the upper surface of the gate insulating film 30, as in the first embodiment.

In the present embodiment, the source electrode 60S and the drain electrode 60D are formed from a material different from the material for the upper surface layer 50. Concretely, the source electrode 60S and the drain electrode 60D have a configuration in which, for example, a titanium (Ti) layer 61 having a thickness of 20 nm, an aluminum (Al) layer 62 having a thickness of 200 nm, and a titanium (Ti) layer 63 having a thickness of 20 nm are stacked in that order.

The source electrode 60S and the drain electrode 60D are formed from a material different from the material for the upper surface layer 50 and, thereby, the following three advantages are obtained.

First Advantage

There is a possibility that a lower cost metal as compared with that in the first embodiment is selected as the constituent material of the source electrode 60S and the drain electrode 60D and, thereby, a cost reduction in organic TFT 100, which is a product, may be linked. As for the organic semiconductor, in many cases, it is desirable to select a metal having a work function of 5 eV or less in general in order to obtain good ohmic contact with a semiconductor. However, there is a limit to the metal having such a work function and a property capable of being wet-etched. A typical metal having such a property is gold (Au), which is a high cost material. Therefore, in the case where all the source electrode 60S, the drain electrode 60D, and the upper surface layer 50 are formed from gold, the cost of the wiring material increases. In the case where the source electrode 60S and the drain electrode 60D are specified to be formed from a material different from the material for the upper surface layer 50, the material cost may be reduced while good ohmic contact is ensured by the upper surface layer 50 formed from gold.

Second Advantage

In a manufacturing method described later, as for a method for forming the film of the source electrode 60S and the drain electrode 60D, a higher-speed film formation method, which is different from the method selected in the first embodiment, is selected in some cases and, thereby, a film formation step with a shorter takt time may be introduced. As a result, this is also linked to a cost reduction in organic TFT 100, which is a product.

In a manufacturing method described later, when the source-drain electrode material film 60A is formed, the upper surface of the organic semiconductor layer 40 is in the state of being covered with the upper surface layer material film 50A, as in the first embodiment. Therefore, even a high-speed film formation method (film formation method in which metal particles reaching a substrate surface have large energy), e.g., a sputtering method or a CVD method, is selected as the method for forming the source-drain electrode material film 60A, damage to the organic semiconductor layer 40 may be reduced.

Third Advantage

As for the constituent material for the source electrode 60S and the drain electrode 60D, a metal having adhesion different from that in the first embodiment may be selected. For example, in the case where the source electrode 60S and the drain electrode 60D are formed from gold (Au), in general, gold (Au) has weak adhesion to the substrate and may be peeled partly to cause an occurrence of break in the wirings of the source electrode 60S, the drain electrode 60D, and the like. However, for example, in the case where the source electrode 60S and the drain electrode 60D are specified to have a laminate structure and a material having high adhesion, e.g., titanium (Ti) and chromium (Cr), is introduced as a lower layer of the laminate structure, the wirings of the source electrode 60S, the drain electrode 60D, and the like may not be peeled and good ohmic contact is ensured by the upper surface layer 50 formed from gold.

This organic TFT 100 may be formed as described below, for example.

Figure 8A:
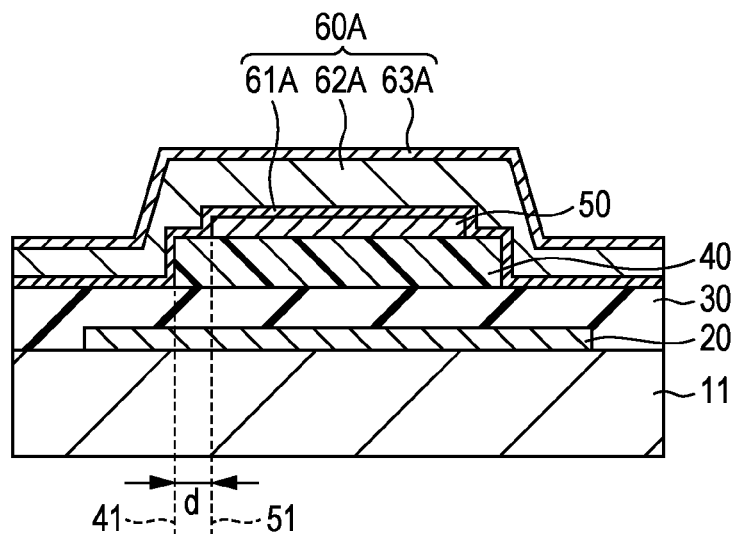
FIGS. 8A and 8B are sectional views showing a method for manufacturing the organic TFT shown in FIGS. 7A and 7B in the order of steps.
Figure 8B:
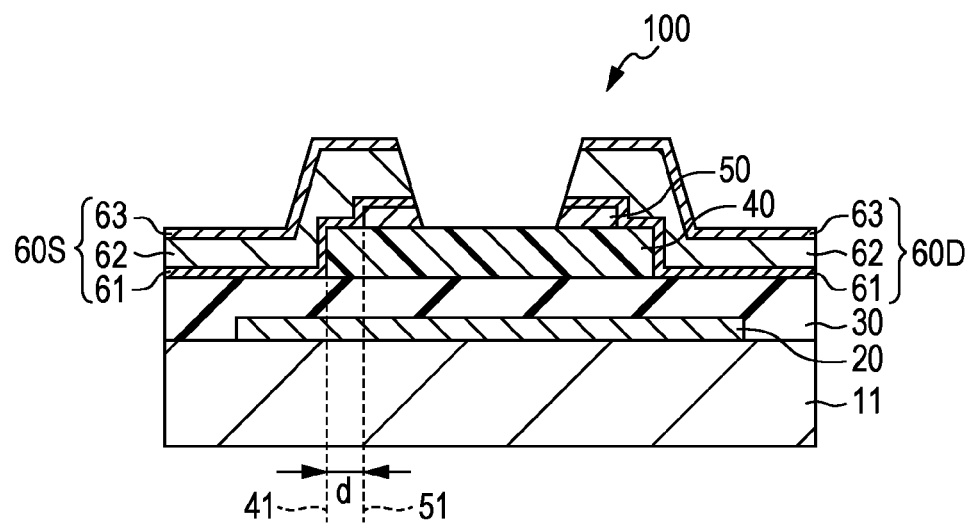

FIGS. 8A and 8B show a method for manufacturing the organic TFT 100 shown in FIGS. 7A and 7B in the order of steps. The same steps as those in the first embodiment are explained with reference to FIGS. 2A to 3C.

Initially, the gate electrode 20 and the gate insulating film 30 are formed sequentially on the substrate 11 formed from the above-described material through the step shown in FIG. 2A, as in the first embodiment. The organic semiconductor material film 40A formed from the above-described organic semiconductor material, e.g., a PXX derivative, is formed on the gate insulating film 30 through the step shown in FIG. 2A likewise, as in the first embodiment.

Subsequently, the upper surface layer material film 50A formed from, for example, gold (Au) having a thickness of, for example, 50 nm is formed on the organic semiconductor material film 40A by, for example, resistance heating vacuum evaporation through the step shown in FIG. 2A likewise, as in the first embodiment.

After the upper surface layer material film 50A is formed, a photoresist is applied to the surface of the upper surface layer material film 50A, so as to form the photoresist film 71 through the step shown in FIG. 2A likewise, as in the first embodiment.

After the photoresist film 71 is formed, the photoresist film 71 is shaped into, for example, a rectangular semiconductor element isolation pattern 100 µm square by, for example, photolithography through the step shown in FIG. 2B, as in the first embodiment. In this regard, the shape and the dimension of the semiconductor element isolation pattern are not limited to those in the above-described example.

After the photoresist film 71 is shaped, the upper surface layer material film 50A is wet-etched by using the resulting photoresist film 71 as a mask, so as to form the upper surface layer 50 through the step shown in FIG. 2C, as in the first embodiment. At that time, the combination of a material for the upper surface layer 50 (or upper surface layer material film 50A) and an etching solution is as in the first embodiment.

After the upper surface layer 50 is formed, the organic semiconductor material film 40A is etched by using the photoresist film 71 as a mask, so as to form the organic semiconductor layer 40 through the step shown in FIG. 3A, as in the first embodiment. An etching method at that time is the same as that in the first embodiment.

After the organic semiconductor layer 40 is formed, edge trimming is performed, where the outer edge portion of the upper surface layer 50 is removed leaving the photoresist film 71 through the step shown in FIG. 3B, as in the first embodiment. Consequently, the outline 51 of the upper surface layer 50 is recessed inside the outline 41 of the organic semiconductor layer 40. The edge trimming method is the same as that in the first embodiment.

After the edge trimming of the upper surface layer 50 is completed, the photoresist film 71 is peeled off through the step shown in FIG. 3C, as in the first embodiment.

After the photoresist film 71 is peeled off, as shown in FIG. 8A, a source-drain electrode material film 60A formed from a material different from that for the upper surface layer 50 is formed all over the surface of the substrate 11 by, for example, a sputtering method or a CVD method. Concretely, as for the source-drain electrode material film 60A, for example, a titanium (Ti) layer 61A having a thickness of 20 nm, an aluminum (Al) layer 62A having a thickness of 200 nm, and a titanium (Ti) layer 63A having a thickness of 20 nm are stacked in that order.

A photoresist film (not shown in the drawing) is formed on the source-drain electrode material film 60A and is shaped into a predetermined shape by, for example, photolithography. Then, the source-drain electrode material film 60A and the upper surface layer 50 are etched by using the resulting photoresist film (not shown in the drawing) as a mask. Consequently, as shown in FIG. 8B, the source electrode 60S and the drain electrode 60D are disposed discretely from each other on the upper surface and the side surface of the organic semiconductor layer 40 provided with the upper surface layer 50 and the upper surface of the gate insulating film 30.

In the present embodiment, the source-drain electrode material film 60A is formed from a metal of a type different from the type of the metal for the upper surface layer 50. Therefore, working of the source electrode 60S and the drain electrode 60D is difficult as compared with the case where the same type of metal is used, in contrast to the first embodiment. The reason is that in the case where a laminate film formed from different metal materials is wet-etched, desired patterning may become difficult because of galvanic corrosion. In order to avoid this, for example, the following method may be used. Initially, the titanium (Ti) layer 61A, the aluminum (Al) layer 62A, and the titanium (Ti) layer 63A of the source-drain electrode material film 60A are worked by dry etching with $CH_4$ (with respect to Ti) and $Cl_2$ (with respect to Al). Thereafter, the upper surface layer 50 formed from Au is wet-etched by using a potassium iodide aqueous solution.

After the source electrode 60S and the drain electrode 60D are formed, the whole surface of the photoresist film (not shown in the drawing) is exposed to ultraviolet irradiation and is dipped into a developing solution. Consequently, the photoresist film (not shown in the drawing) is peeled off. In this manner, the organic TFT 100 shown in FIGS. 7A and 7B is completed.

Here, as in the first embodiment, the outline 51 of the upper surface layer 50 is inside the outline 41 of the organic semiconductor layer 40 and, thereby, it is suppressed that an end portion of the upper surface layer 50 extends off the organic semiconductor layer 40 and causes defects in the shape, such as, an eaves portion. Therefore, an occurrence of break because of the source electrode 60S and the drain electrode 60D disposed on the organic semiconductor layer 40 being cut at the eaves portion is suppressed.

As described above, in the present embodiment, the outline 51 of the upper surface layer 50 is specified to be inside the outline 41 of the organic semiconductor layer 40 and, thereby, it may be suppressed that an end portion of the upper surface layer 50 extends off the organic semiconductor layer 40 and causes defects in the shape, such as, eaves portions 52, as in the first embodiment. Consequently, an occurrence of break because of the source electrode 60S and the drain electrode 60D disposed on the organic semiconductor layer 40 being cut at the eaves portions 52 may be suppressed.

The source electrode 60S and the drain electrode 60D are specified to be formed from a metal different from the metal for the upper surface layer 50 and, thereby, the cost may be reduced and the adhesion of the source electrode 60S and the drain electrode 60D may be enhanced.

Third Embodiment

A third embodiment of the present disclosure will be described below. An organic TFT 100 according to the present embodiment has the same configuration, operation, and effects as those of the organic TFT 100 explained with reference to FIGS. 7A and 7B in the above-described second embodiment except that the upper surface layer 50 is formed from a metal oxide. Therefore, in the explanation, the corresponding constituents are indicated by the same reference numerals.

The substrate 11, the gate electrode 20, the gate insulating film 30, and the organic semiconductor layer 40 have the same configurations as those in the first embodiment.

The upper surface layer 50 is disposed on the upper surface of the organic semiconductor layer 40 and is a contact layer to electrically connect the organic semiconductor layer 40 to the source electrode 60S and the drain electrode 60D favorably, as in the first embodiment. Therefore, it is preferable that the upper surface layer 50 is formed from an electrically conductive material, in particular a metal oxide, capable of providing ohmic contact with the organic semiconductor layer 40 by itself. Furthermore, the upper surface layer 50 has also a function as a protective film to prevent direct contact of the organic semiconductor layer 40 with a photoresist in a production process described later. It is preferable that the upper surface layer 50 is formed from a material capable of being wet-etched. Examples of constituent materials of such an upper surface layer 50 include $CuO_x$, $NiO_x$, $TiO_x$, indium tin oxide (ITO), $MoO_x$, and $WO_x$. Concretely, for example, the upper surface layer 50 is formed from ITO having a thickness of 50 nm. ITO has a high work function and, thereby, it is possible to provide an excellent function as a hole injection layer to the upper surface layer 50.

The outline 51 of the upper surface layer 50 is inside the outline 41 of the organic semiconductor layer 40, as in the first embodiment. Consequently, regarding this organic TFT 100, defects in the shape of the upper surface layer 50 may be reduced, as in the first embodiment.

The source electrode 60S and the drain electrode 60D are disposed discretely from each other on the upper surface and the side surface of the organic semiconductor layer 40 provided with the upper surface layer 50 and the upper surface of the gate insulating film 30, as in the first embodiment.

The source electrode 60S and the drain electrode 60D have a configuration in which, for example, the titanium (Ti) layer 61 having a thickness of 20 nm, the aluminum (Al) layer 62 having a thickness of 200 nm, and the titanium (Ti) layer 63 having a thickness of 20 nm are stacked in that order, as in the second embodiment.

This organic TFT 100 may be formed as described below, for example. The same steps as those in the first embodiment are explained with reference to FIGS. 2A to 3C, and the same steps as those in the second embodiment are explained with reference to FIGS. 8A and 8B.

Initially, the gate electrode 20 and the gate insulating film 30 are formed sequentially on the substrate 11 formed from the above-described material through the step shown in FIG.

2A, as in the first embodiment. The organic semiconductor material film 40A formed from the above-described organic semiconductor material, e.g., a PXX derivative, is formed on the gate insulating film 30 through the step shown in FIG. 2A likewise, as in the first embodiment.

Subsequently, the upper surface layer material film 50A formed from, for example, ITO having a thickness of, for example, 50 nm is formed on the organic semiconductor material film 40A by, for example, the sputtering method, as shown in FIG. 2A likewise.

After the upper surface layer material film 50A is formed, a photoresist is applied to the surface of the upper surface layer material film 50A, so as to form the photoresist film 71 through the step shown in FIG. 2A likewise, as in the first embodiment.

After the photoresist film 71 is formed, the photoresist film 71 is shaped into, for example, a rectangular semiconductor element isolation pattern 100 µm square by, for example, photolithography through the step shown in FIG. 2B, as in the first embodiment. In this regard, the shape and the dimension of the semiconductor element isolation pattern are not limited to those in the above-described example.

After the photoresist film 71 is shaped, the upper surface layer material film 50A is wet-etched by using the resulting photoresist film 71 as a mask, so as to form the upper surface layer 50 through the step shown in FIG. 2C, as in the first embodiment. As for an etching solution, an oxalic acid aqueous solution; an oxalic acid aqueous solution and dodecylbenzenesulfonic acid; and the like may be used.

After the upper surface layer 50 is formed, the organic semiconductor material film 40A is etched by using the photoresist film 71 as a mask, so as to form the organic semiconductor layer 40 through the step shown in FIG. 3A, as in the first embodiment. An etching method at that time is the same as that in the first embodiment.

After the organic semiconductor layer 40 is formed, edge trimming is performed, where the outer edge portion of the upper surface layer 50 is removed leaving the photoresist film 71 through the step shown in FIG. 3B, as in the first embodiment. As for the edge trimming method, wet etching is employed, where an oxalic acid aqueous solution; an oxalic acid aqueous solution and dodecylbenzenesulfonic acid; or the like is used as the etching solution, in the same manner as the step to etch the upper surface layer material film 50A, as shown in FIG. 2C. Consequently, etching proceeds from the side surface of the upper surface layer 50 toward the lateral direction and the outline 51 of the upper surface layer 50 is recessed inside the outline 41 of the organic semiconductor layer 40.

After the edge trimming of the upper surface layer 50 is completed, the photoresist film 71 is peeled off through the step shown in FIG. 3C, as in the first embodiment.

After the photoresist film 71 is peeled off, the source-drain electrode material film 60A formed from a material different from that for the upper surface layer 50 is formed all over the surface of the substrate 11 by, for example, a sputtering method or a CVD method through the step shown in FIG. 8A, as in the second embodiment. Concretely, as for the source-drain electrode material film 60A, for example, a titanium (Ti) layer 61A having a thickness of 20 nm, an aluminum (Al) layer 62A having a thickness of 200 nm, and a titanium (Ti) layer 63A having a thickness of 20 nm are stacked in that order.

A photoresist film (not shown in the drawing) is formed on the source-drain electrode material film 60A and is shaped into a predetermined shape by, for example, photolithography. Then, the source-drain electrode material film 60A and the upper surface layer 50 are etched by using the resulting photoresist film (not shown in the drawing) as a mask.

As for the etching method at that time, initially, the titanium (Ti) layer 61A, the aluminum (Al) layer 62A, and the titanium (Ti) layer 63A of the source-drain electrode material film 60A are worked by dry etching with $CH_4$ (with respect to Ti) and $Cl_2$ (with respect to Al), as in the second embodiment. Thereafter, the upper surface layer 50 formed from ITO is wet-etched. As for an etching solution at that time, an oxalic acid aqueous solution; an oxalic acid aqueous solution and dodecylbenzenesulfonic acid; or the like is used.

Consequently, as shown in FIG. 8B, the source electrode 60S and the drain electrode 60D are disposed discretely from each other on the upper surface and the side surface of the organic semiconductor layer 40 provided with the upper surface layer 50 and the upper surface of the gate insulating film 30.

After the source electrode 60S and the drain electrode 60D are formed, the whole surface of the photoresist film (not shown in the drawing) is exposed to ultraviolet irradiation and is dipped into a developing solution. Consequently, the photoresist film (not shown in the drawing) is peeled off. In this manner, the organic TFT 100 shown in FIGS. 7A and 7B is completed.

Here, as in the first embodiment, the outline 51 of the upper surface layer 50 is inside the outline 41 of the organic semiconductor layer 40 and, thereby, it is suppressed that an end portion of the upper surface layer 50 extends off the organic semiconductor layer 40 and causes defects in the shape, such as, an eaves portion. Therefore, an occurrence of break because of the source electrode 60S and the drain electrode 60D disposed on the organic semiconductor layer 40 being cut at the eaves portion is suppressed.

As described above, in the present embodiment, the outline 51 of the upper surface layer 50 is specified to be inside the outline 41 of the organic semiconductor layer 40 and, thereby, it may be suppressed that an end portion of the upper surface layer 50 extends off the organic semiconductor layer 40 and causes defects in the shape, such as, eaves portions 52, as in the first embodiment. Consequently, an occurrence of break because of the source electrode 60S and the drain electrode 60D disposed on the organic semiconductor layer 40 being cut at the eaves portions 52 may be suppressed.

The upper surface layer 50 is specified to be formed from the metal oxide. Consequently, oxidation of the electrode surface does not occur at the interface at which the semiconductor and the electrode come into contact with each other, so that the contact characteristics are stabilized.

In the above-described third embodiment, the case where the source electrode 60S and the drain electrode 60D have a configuration in which the titanium (Ti) layer 61, the aluminum (Al) layer 62, and the titanium (Ti) layer 63 are stacked in that order, as in the second embodiment, is explained. However, the source electrode 60S and the drain electrode 60D may be formed from gold (Au), as in the first embodiment. Alternatively, the source electrode 60S and the drain electrode 60D may be formed from other metal materials, e.g., copper, silver, nickel, titanium, or the like, besides gold (Au).

Fourth Embodiment

A fourth embodiment of the present disclosure will be described below. An organic TFT 100 according to the present embodiment has the same configuration, operation, and effects as those of the organic TFT 100 explained with reference to FIGS. 7A and 7B in the above-described second embodiment except that the upper surface layer 50 is formed from an electrically conductive polymer. Therefore, in the explanation, the corresponding constituents are indicated by the same reference numerals.

The substrate 11, the gate electrode 20, the gate insulating film 30, and the organic semiconductor layer 40 have the same configurations as those in the first embodiment.

The upper surface layer 50 is disposed on the upper surface of the organic semiconductor layer 40 and is a contact layer to electrically connect the organic semiconductor layer 40 to the source electrode 60S and the drain electrode 60D favorably, as in the first embodiment. Therefore, it is preferable that the upper surface layer 50 is formed from an electrically conductive material, in particular an electrically conductive polymer, capable of providing ohmic contact with the organic semiconductor layer 40 by itself. Furthermore, the upper surface layer 50 has also a function as a protective film to prevent direct contact of the organic semiconductor layer 40 with a photoresist in a production process described later. It is preferable that the upper surface layer 50 is formed from a material capable of being wet-etched. Examples of constituent materials of such an upper surface layer 50 include water-soluble PEDOT-PSS. The thickness of the upper surface layer 50 is, for example, about 50 nm.

The outline 51 of the upper surface layer 50 is inside the outline 41 of the organic semiconductor layer 40, as in the first embodiment. Consequently, regarding this organic TFT 100, defects in the shape of the upper surface layer 50 may be reduced, as in the first embodiment.

The source electrode 60S and the drain electrode 60D are disposed discretely from each other on the upper surface and the side surface of the organic semiconductor layer 40 provided with the upper surface layer 50 and the upper surface of the gate insulating film 30, as in the first embodiment.

The source electrode 60S and the drain electrode 60D have a configuration in which, for example, the titanium (Ti) layer 61 having a thickness of 20 nm, the aluminum (Al) layer 62 having a thickness of 200 nm, and the titanium (Ti) layer 63 having a thickness of 20 nm are stacked in that order, as in the second embodiment.

This organic TFT 100 may be formed as described below, for example. The same steps as those in the first embodiment are explained with reference to FIGS. 2A to 3C, and the same steps as those in the second embodiment are explained with reference to FIGS. 8A and 8B.

Initially, the gate electrode 20 and the gate insulating film 30 are formed sequentially on the substrate 11 formed from the above-described material through the step shown in FIG. 2A, as in the first embodiment. The organic semiconductor material film 40A formed from the above-described organic semiconductor material, e.g., a PXX derivative, is formed on the gate insulating film 30 through the step shown in FIG. 2A likewise, as in the first embodiment.

Subsequently, the upper surface layer material film 50A formed from, for example, PEDOT-PSS having a thickness of, for example, about 50 nm is formed on the organic semiconductor material film 40A by a coating method, e.g., a spin coating method, as shown in FIG. 2A likewise.

After the upper surface layer material film 50A is formed, a photoresist is applied to the surface of the upper surface layer material film 50A, so as to form the photoresist film 71 through the step shown in FIG. 2A likewise, as in the first embodiment.

After the photoresist film 71 is formed, the photoresist film 71 is shaped into, for example, a rectangular semiconductor element isolation pattern 100 μm square by, for example, photolithography through the step shown in FIG. 2B, as in the first embodiment. In this regard, the shape and the dimension of the semiconductor element isolation pattern are not limited to those in the above-described example.

After the photoresist film 71 is shaped, the upper surface layer material film 50A is wet-etched by using the resulting photoresist film 71 as a mask, so as to form the upper surface layer 50 through the step shown in FIG. 2C, as in the first embodiment. As for an etching solution, water may be used.

After the upper surface layer 50 is formed, the organic semiconductor material film 40A is etched by using the photoresist film 71 as a mask, so as to form the organic semiconductor layer 40 through the step shown in FIG. 3A, as in the first embodiment. An etching method at that time is the same as that in the first embodiment.

After the organic semiconductor layer 40 is formed, edge trimming is performed, where the outer edge portion of the upper surface layer 50 is removed leaving the photoresist film 71 through the step shown in FIG. 3B, as in the first embodiment. As for the edge trimming method, wet etching is employed, where water is used as the etching solution, in the same manner as the step to etch the upper surface layer material film 50A, as shown in FIG. 2C. Consequently, etching proceeds from the side surface of the upper surface layer 50 toward the lateral direction and the outline 51 of the upper surface layer 50 is recessed inside the outline 41 of the organic semiconductor layer 40.

After the edge trimming of the upper surface layer 50 is completed, the photoresist film 71 is peeled off through the step shown in FIG. 3C, as in the first embodiment.

After the photoresist film 71 is peeled off, the source-drain electrode material film 60A formed from a material different from that for the upper surface layer 50 is formed all over the surface of the substrate 11 by, for example, a sputtering method or a CVD method through the step shown in FIG. 8A, as in the second embodiment. Concretely, as for the source-drain electrode material film 60A, for example, the titanium (Ti) layer 61A having a thickness of 20 nm, the aluminum (Al) layer 62A having a thickness of 200 nm, and the titanium (Ti) layer 63A having a thickness of 20 nm are stacked in that order.

A photoresist film (not shown in the drawing) is formed on the source-drain electrode material film 60A and is shaped into a predetermined shape by, for example, photolithography. Then, the source-drain electrode material film 60A and the upper surface layer 50 are etched by using the resulting photoresist film (not shown in the drawing) as a mask.

As for the etching method at that time, initially, the titanium (Ti) layer 61A, the aluminum (Al) layer 62A, and the titanium (Ti) layer 63A of the source-drain electrode material film 60A are worked by dry etching with $CH_4$ (with respect to Ti) and $Cl_2$ (with respect to Al), as in the second embodiment. Thereafter, the upper surface layer 50 formed from PEDOT-PSS is wet-etched. As for an etching solution at that time, water is used.

Consequently, as shown in FIG. 8B, the source electrode 60S and the drain electrode 60D are disposed discretely from each other on the upper surface and the side surface of the organic semiconductor layer 40 provided with the upper surface layer 50 and the upper surface of the gate insulating film 30.

After the source electrode 60S and the drain electrode 60D are formed, the whole surface of the photoresist film (not shown in the drawing) is exposed to ultraviolet irradiation and is dipped into a developing solution. Consequently, the photoresist film (not shown in the drawing) is peeled off. In this manner, the organic TFT 100 shown in FIGS. 7A and 7B is completed.

Here, as in the first embodiment, the outline 51 of the upper surface layer 50 is inside the outline 41 of the organic semiconductor layer 40 and, thereby, it is suppressed that an end portion of the upper surface layer 50 extends off the organic semiconductor layer 40 and causes defects in the shape, such as, an eaves portion. Therefore, an occurrence of break because of the source electrode 60S and the drain electrode 60D disposed on the organic semiconductor layer 40 being cut at the eaves portion is suppressed.

As described above, in the present embodiment, the outline 51 of the upper surface layer 50 is specified to be inside the outline 41 of the organic semiconductor layer 40 and, thereby, it may be suppressed that an end portion of the upper surface layer 50 extends off the organic semiconductor layer 40 and causes defects in the shape, such as, eaves portions 52, as in the first embodiment. Consequently, an occurrence of break because of the source electrode 60S and the drain electrode 60D disposed on the organic semiconductor layer 40 being cut at the eaves portions 52 is suppressed.

The upper surface layer 50 is specified to be formed from the electrically conductive polymer. Consequently, oxidation of the electrode surface does not occur at the interface at which the semiconductor and the electrode come into contact with each other, so that the contact characteristics are stabilized. Furthermore, the process is somewhat simplified as compared with that in the case where the vacuum film formation method is employed.

In the above-described fourth embodiment, the case where the source electrode 60S and the drain electrode 60D have a configuration in which the titanium (Ti) layer 61, the aluminum (Al) layer 62, and the titanium (Ti) layer 63 are stacked in that order, as in the second embodiment, is explained. However, the source electrode 60S and the drain electrode 60D may be formed from gold (Au), as in the first embodiment. Alternatively, the source electrode 60S and the drain electrode 60D may be formed from other metal materials, e.g., copper, silver, nickel, titanium, or the like, besides gold (Au).

Display Device

Figure 9A:
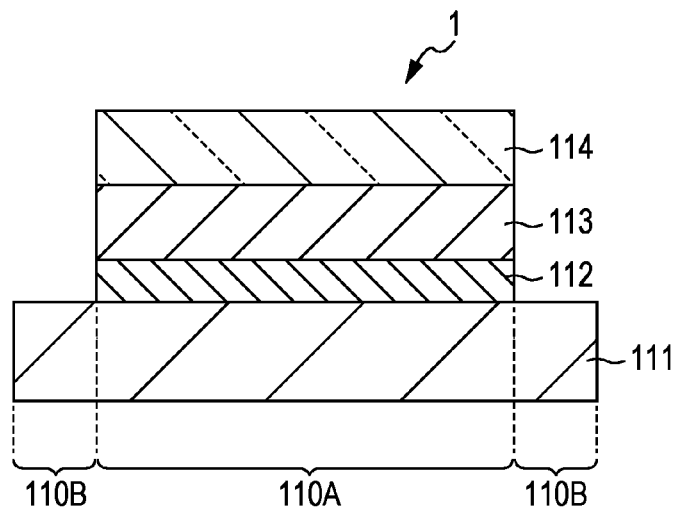
FIGS. 9A and 9B are diagrams showing a configuration example of a display device provided with an organic TFT.
Figure 9B:
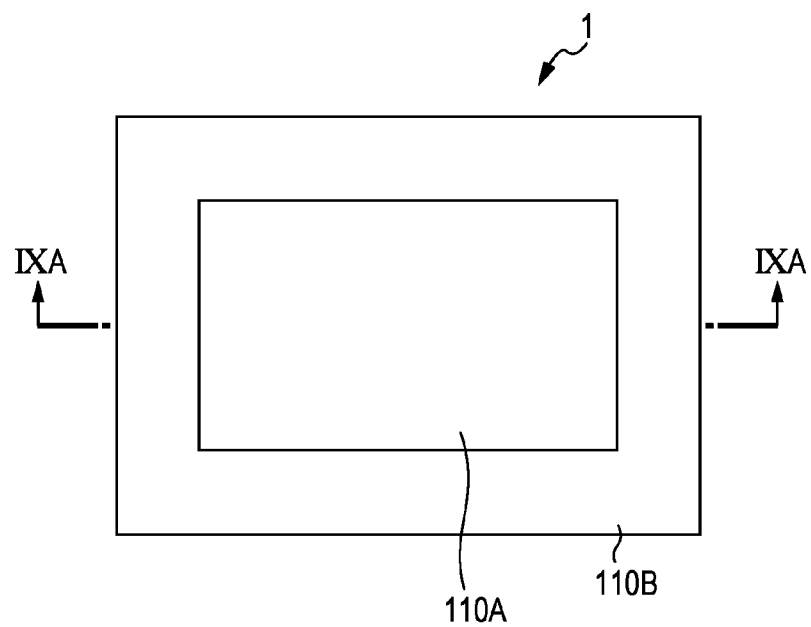

FIGS. 9A and 9B schematically show the rough configuration of a display device provided with the above-described organic TFT 100. FIG. 9B shows the two-dimensional configuration (upper surface configuration) and FIG. 9A shows the configuration of a section taken along a line IXA-IXA shown in FIG. 9B, viewed from a direction indicated by arrows. In this display device 1, a substrate 111, a TFT layer 112, a display layer 113, and a transparent substrate 114 are stacked in that order. Concretely, the TFT layer 112, the display layer 113, and the transparent substrate 114 are stacked on a display region 110A of the substrate 111, whereas the TFT layer 112, the display layer 113, and the transparent substrate 114 are not stacked on the frame region (non-display region) 110B of the substrate 111.

The substrate 111 is formed from, for example, an inorganic material, e.g., glass, quartz, silicon, or gallium arsenide, a plastic material, e.g., polyimide, polyethylene terephthalate (PET), polyethylene naphthalate (PEN), polymethyl methacrylate (PMMA), polycarbonate (PC), polyethersulfone (PES), polyethyl ether ketone (PEEK), or aromatic polyester (liquid crystal polymer), or the like. This substrate 111 may be a rigid substrate, e.g., a wafer, or be a flexible substrate, e.g., thin-layer glass or a film.

The TFT layer 112 is a layer containing a plurality of devices including a thin film (an electrically conductive film, e.g., a metal film, an insulating film, or the like). Examples of the devices include capacitor elements (a storage capacitor element and the like), wirings (a scanning line, a signal line, and the like), and electrodes (a pixel electrode and the like), besides TFT serving as a switching element to select a pixel. That is, the device contained in the TFT layer 112 is at least one of TFTs, capacitor elements, wirings, and electrodes. Here, TFT contained in the TFT layer 112 is formed from the organic TFT 100 in the above-described embodiment.

The display layer 113 has electrophoresis particles between, for example, a pixel electrode and a common electrode. That is, the display device 1 is an electrophoretic display (so-called electronic paper display) to display images (for example, character information) making use of an electrophoretic phenomenon. The pixel electrode is disposed on a pixel basis in the TFT layer 112, and the common electrode is disposed all over one surface of the transparent electrode 114.

The transparent electrode 114 is formed by using, for example, the same material as that for the substrate 111. In this regard, a moistureproof film to prevent entry of moisture into the display layer 113 and an optical function film to prevent reflection of external light in a display surface may be further disposed on the transparent electrode 114.

A barrier layer may be disposed between the substrate 111 and the TFT layer 112 in order to prevent degradation of the TFT layer 112 and the display layer 113 due to moisture and organic gases. Such a barrier layer is formed from, for example, $AlO_xN_{1-x}$ (where x=0.01 to 0.2) or silicon nitride ($Si_3N_4$).

This display device 1 may be produced as described below, for example. Initially, the TFT layer 112 containing the above-described various devices is formed on the substrate 111 (concretely, on the display region 110A of the substrate 111) by using photolithography.

Then, the display layer 113 is formed on the TFT layer 112 by using, for example, photolithography likewise. Thereafter, the transparent electrode 114 is bonded on the display layer 113. In this manner, the display device 1 shown in FIG. 9A and FIG. 9B is completed.

APPLICATION EXAMPLES

Next, application examples of the display device 1 will be described with reference to FIG. 10A to FIG. 15G. The display device 1 may be applied to electronic apparatuses in any field of television apparatuses, digital cameras, notebook-size personal computers, portable terminal devices, e.g., cellular phones, video cameras, or the like. Put another way, this display device 1 may be applied to electronic apparatuses in any field, wherein picture signals input from the outside or picture signals generated in the inside are displayed as images or pictures.

Application Example 1

Figure 10A:
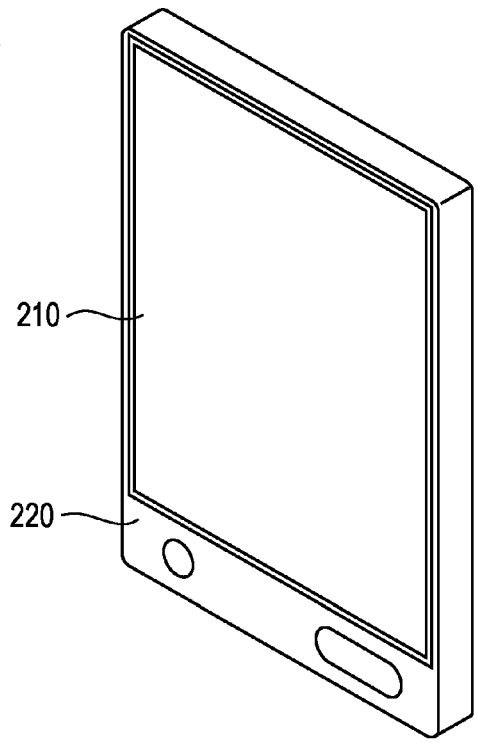
FIGS. 10A and 10B are perspective views showing outward appearances of Application example 1 of the display device shown in FIGS. 9A and 9B.
Figure 10B:
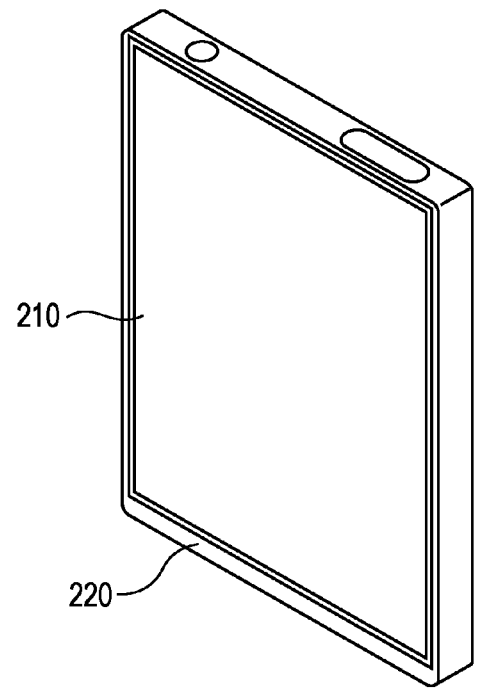

Each of FIG. 10A and FIG. 10B shows an outward appearance of an electronic book to which the display device 1 is applied. This electronic book has, for example, a display portion 210 and a non-display portion 220, and this display portion 210 is formed from the display device 1.

Application Example 2

Figure 11:
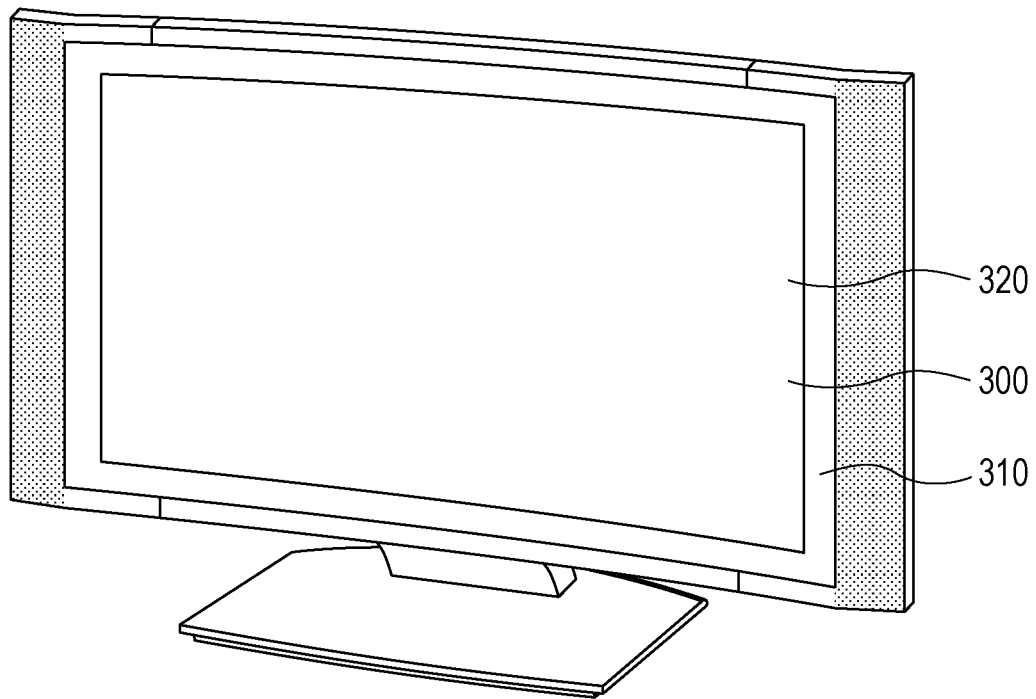
FIG. 11 is a perspective view showing an outward appearance of Application example 2.

FIG. 11 shows an outward appearance of a television apparatus to which the display device 1 is applied. This television apparatus has, for example, a picture display screen portion 300 containing a front panel 310 and filter glass 320, and this picture display screen portion 300 is formed from the display device 1.

19

Application Example 3

Figure 12A:
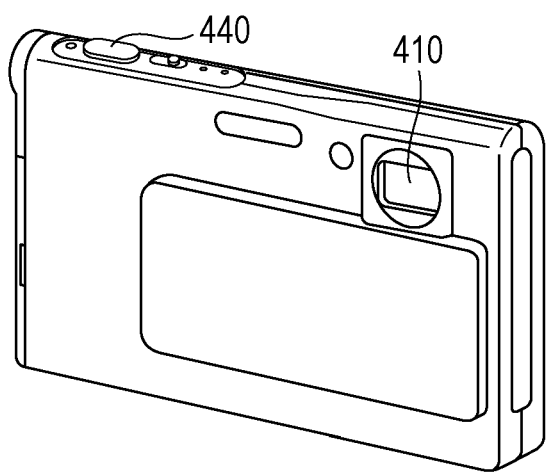
FIG. 12A is a perspective view showing an outward appearance of Application example 3, viewed from the front side.
Figure 12B:
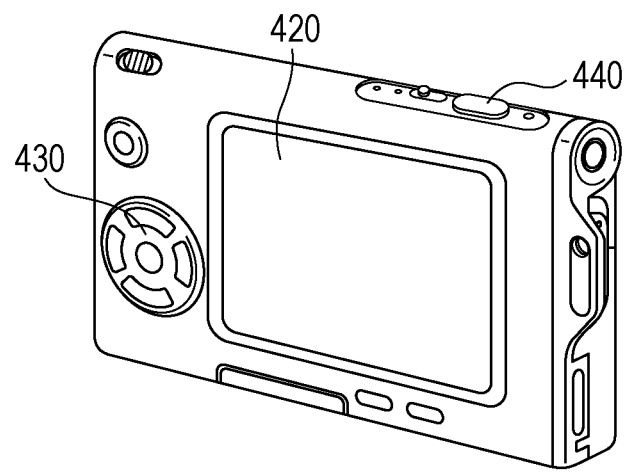
FIG. 12B is a perspective view showing an outward appearance viewed from the back side.

FIGS. 12A and 12B show an outward appearance of a digital camera to which the display device 1 is applied. This digital camera has, for example, a flash light emission portion 410, a display portion 420, a menu switch 430, and a shutter button 440, and this display portion 420 is formed from the display device 1.

Application Example 4

Figure 13:
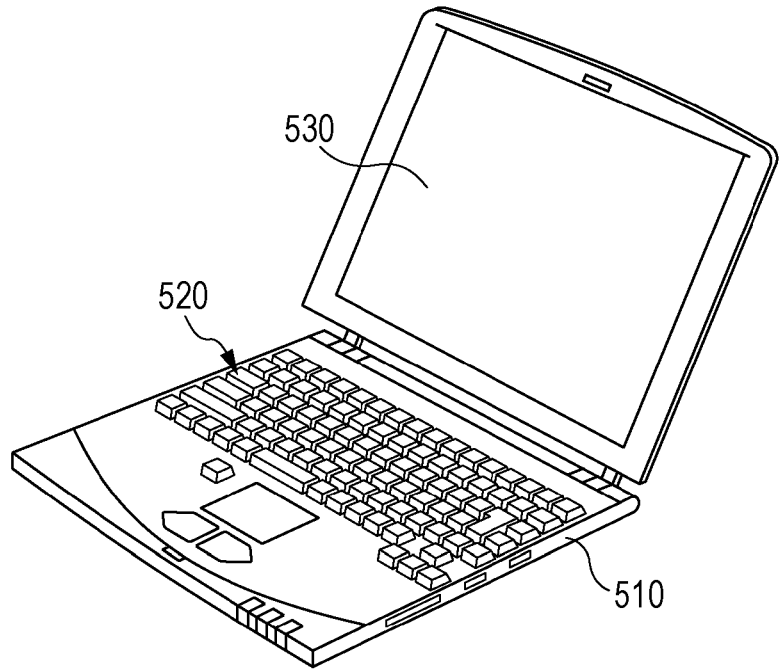
FIG. 13 is a perspective view showing an outward appearance of Application example 4.

FIG. 13 shows an outward appearance of a notebook-size personal computer to which the display device 1 is applied. This notebook-size personal computer has, for example, a main body 510 and a keyboard 520 for input operations of letters and the like, and a display portion 530 to display images, and this display portion 530 is formed from the display device 1.

Application Example 5

Figure 14:
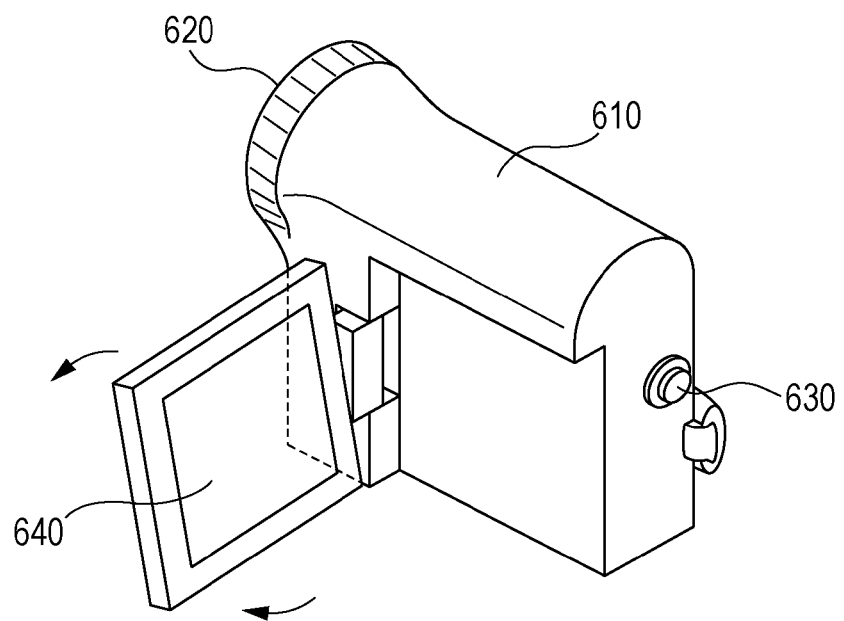
FIG. 14 is a perspective view showing an outward appearance of Application example 5.

FIG. 14 shows an outward appearance of a video camera to which the display device 1 is applied. This video camera has, for example, a main body 610, a lens 620 for photographing a subject, the lens 620 being disposed on the frontward side surface of this main body portion 610, a photographing start/stop switch 630, and a display portion 640. This display portion 640 is formed from the display device 1.

Application Example 6

FIGS. 15A to 15G shows an outward appearance of a cellular phone to which the display device 1 is applied. This cellular phone is produced by, for example, joining an upper side casing 710 and a lower side casing 720 with a junction portion (hinge portion) 730 and has a display 740, a sub-display 750, a picture light 760, and a camera 770. Among them, the display 740 or the sub-display 750 is formed from the display device 1.

Up to this point the present disclosure has been explained with reference to the embodiments. However, the present disclosure is not limited to the above-described embodiments and various modifications may be made. For example, the materials and thicknesses of the individual layers, film formation methods, film formation conditions, and the like explained in the above-described embodiments are not limited, and other materials and thicknesses may be employed, or other film formation methods and film formation conditions may be employed.

Figure 16A:
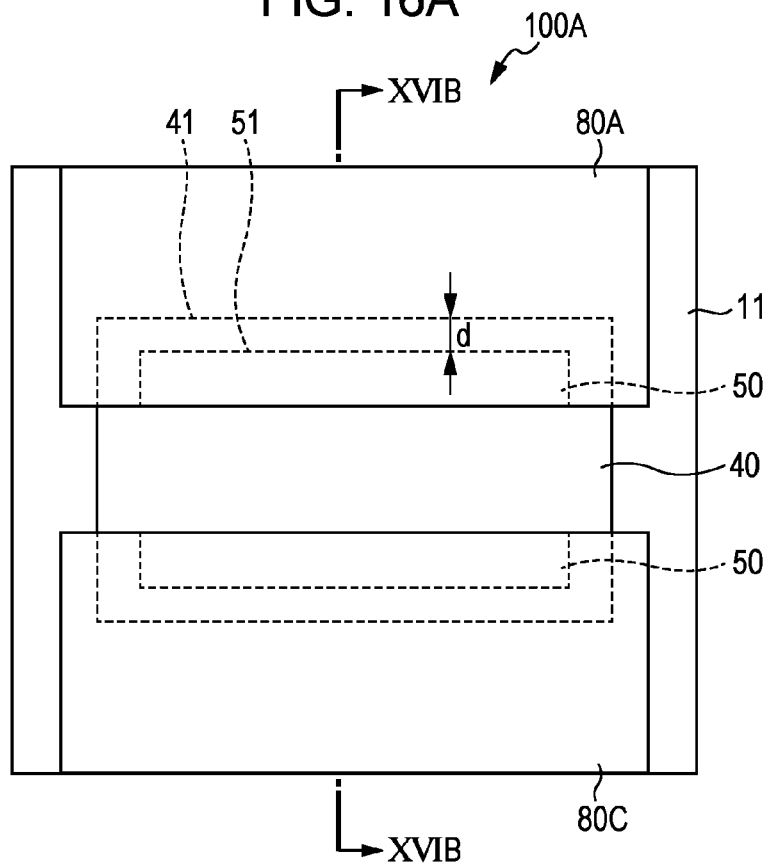
FIG. 16A is a plan view showing the configuration of an organic semiconductor diode according to an embodiment of the present disclosure.
Figure 16B:
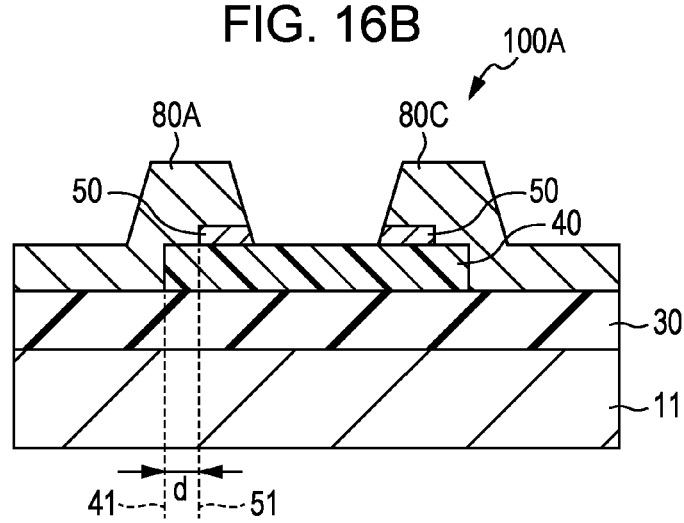
FIG. 16B is a sectional view showing the configuration along a line XVIB-XVIB shown in FIG. 16A.

In the above-described embodiment, the organic TFT is explained as an example, although the present disclosure may be applied to other semiconductor elements by using organic semiconductors, e.g., diodes, besides the organic TFT. FIGS. 16A and 16B show an example of an organic semiconductor diode according to an embodiment of the present disclosure. This organic semiconductor diode 100A has the same configuration as the configuration of the organic TFT 100 shown in FIGS. 1A and 1B except that the gate electrode 20 is removed, and includes an insulating film 30, an organic semiconductor layer 40, an upper surface layer 50, an anode 80A, and a cathode 80C on a substrate 11 in that order. Such an organic semiconductor diode 100A may be present in the same substrate as that of the organic TFT 100 and be formed conveniently in the same production process as that of the organic TFT 100 depending on a circuit. Although not shown in the drawing, a vertical configuration, in which an anode and a cathode are stacked, may be employed.

The present disclosure may employ the following configurations.

(1) A semiconductor element including an organic semiconductor layer and a layer disposed on the upper surface of the above-described organic semiconductor layer, wherein the outline of the above-described layer is inside the outline of the above-described organic semiconductor layer.

(2) The semiconductor element according to the above-described item (1), wherein the above-described layer is formed from a metal.

(3) The semiconductor element according to the above-described item (2), wherein a wiring layer is disposed on the upper surface and the side surface of the above-described organic semiconductor layer provided with the above-described layer and the above-described layer is a contact layer of the above-described organic semiconductor layer and the above-described wiring layer.

(4) The semiconductor element according to the above-described item (3), wherein the above-described wiring layer is formed from the same material as that for the above-described layer.

(5) The semiconductor element according to the above-described item (3), wherein the above-described wiring layer is formed from a material different from that for the above-described layer.

(6) The semiconductor element according to the above-described item (1), wherein the above-described layer is formed from a metal oxide.

(7) The semiconductor element according to the above-described item (1), wherein the above-described layer is formed from an electrically conductive polymer.

(8) An electronic apparatus including a semiconductor element, wherein the above-described semiconductor element includes an organic semiconductor layer and a layer disposed on the upper surface of the above-described organic semiconductor layer, and the outline of the above-described layer is inside the outline of the above-described organic semiconductor layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor element comprising:
   an organic semiconductor layer; and
   a layer disposed on the upper surface of the organic semiconductor layer, wherein the outline of the layer is inside the outline of the organic semiconductor layer;
   wherein a wiring layer is disposed on the upper surface and the side surface of the organic semiconductor layer provided with the layer and the layer is in contact with the organic semiconductor layer and the wiring layer, wherein the wiring layer includes a source electrode and a drain electrode, wherein a first portion of the layer lies between a portion of the source electrode and the organic semiconductor layer, wherein a second portion of the layer lies between a portion of the drain electrode and the organic semiconductor layer, and wherein the first and second portions of the layer are separated from one another.

2. The semiconductor element according to claim 1, wherein the layer is formed from a metal.

3. The semiconductor element according to claim 1, wherein the wiring layer is formed from the same material as that for the layer.

4. The semiconductor element according to claim 1, wherein the wiring layer is formed from a material different from that for the layer.

5. The semiconductor element according to claim 1, wherein the layer is formed from a metal oxide.

6. The semiconductor element according to claim 1, wherein the layer is formed from an electrically conductive polymer.

7. An electronic apparatus comprising a semiconductor element,
wherein the semiconductor element includes
an organic semiconductor layer and
a layer disposed on the upper surface of the organic semiconductor layer, and
the outline of the layer is inside the outline of the organic semiconductor layer;
wherein a wiring layer is disposed on the upper surface and the side surface of the organic semiconductor layer provided with the layer and the layer is in contact with the organic semiconductor layer and the wiring layer, wherein the wiring layer includes a source electrode and a drain electrode, wherein a first portion of the layer lies between a portion of the source electrode and the organic semiconductor layer, wherein a second portion of the layer lies between a portion of the drain electrode and the organic semiconductor layer, and wherein the first and second portions of the layer are separated from one another.

8. The semiconductor element according to claim 1, wherein at least a portion of the source electrode is in direct contact with the organic semiconductor layer, and wherein at least a portion of the drain electrode is in direct contact with the organic semiconductor layer.

* * * * *